March 14, 1967 G. J. FRYE 3,309,532
WAVE SHAPING AND VOLTAGE LIMITING CIRCUIT EMPLOYING
PLURAL SNAP-OFF DIODES
Filed March 20, 1964

GEORGE J. FRYE
INVENTOR.
BY
BUCKHORN, BLORE, KLARQUIST & SPARKMAN
ATTORNEYS

United States Patent Office 3,309,532
Patented Mar. 14, 1967

3,309,532

WAVE SHAPING AND VOLTAGE LIMITING CIRCUIT EMPLOYING PLURAL SNAP-OFF DIODES

George J. Frye, Portland, Oreg., assignor to Tektronix, Inc., Beaverton, Oreg., an Oregon corporation Filed Mar. 20, 1964, Ser. No. 353,379
7 Claims. (Cl. 307—88.5)

Figure 1:
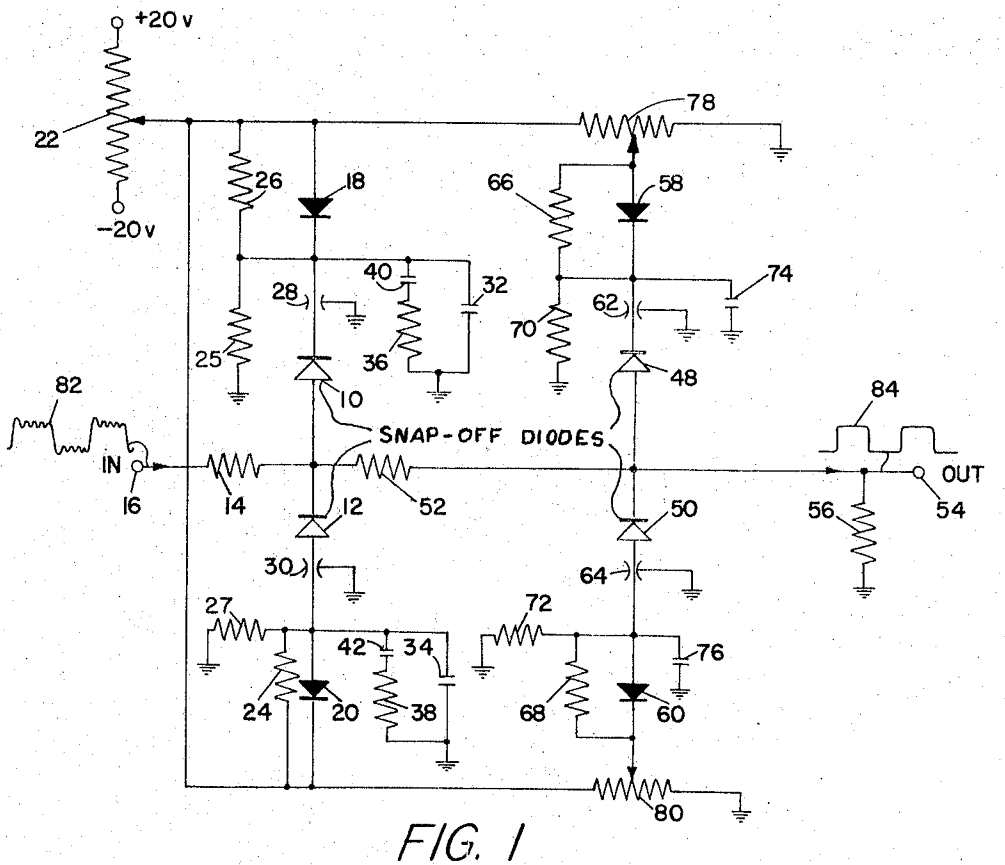

The subject matter of the present invention relates generally to electrical circuits for shaping the wave forms of electrical signals and for limiting the voltage of the output signals of such circuit, and in particular to circuits employing "snap-off" diodes to increase the slope of the leading and/or trailing edge of the signal wave form and to provide such wave form with a flat top and/or bottom portion so that such diodes perform both wave shaping and voltage limiting functions.

The wave shaping and voltage limiting circuit of the present invention is especially useful when employed to shape rectangular voltage pulses having short rise times, such as those delivered by avalanche transistor pulse generators. Briefly, one embodiment of the circuit of the present invention employs a plurality of pairs of series connected snap-off diodes of opposite polarity in successive stages in order to decrease the rise time and fall time of an input signal applied thereto and to limit the maximum and minimum voltages of such signal to produce a rectangular output signal. The rectangular signal so produced may have a rise time on the order of about 0.2 nanoseconds and a fall time of substantially the same value.

The term "snap-off" diode is used herein to refer to a PN junction diode which has the ability to store a large amount of minority carrier charge when such diode is first forwardly biased and subsequently rendered nonconducting. Such a snap-off diode produces an output voltage which does not immediately follow the voltage of an input switching pulse reversely biasing such diode, because the minority current carriers which were injected through the PN junction of such diode during its forward bias condition are stored temporarily after such input switching pulse is applied thereto. Thus, there is a time delay between the application of an input switching pulse which reversely biases the snap-off diode and the production of the resultant output voltage transmitted therefrom. However, after such time delay during which the stored charge of the minority carriers is reduced sufficiently, the output voltage produced across the snap-off diode decreases at an extremely fast rate which may be much faster than that of the input switching pulse. That is to say, snap-off diodes are designed to have high storage of minority carriers as a result of forward bias while conventional diodes are designed for minimum storage of such minority carriers. One such snap-off diode is described in more detail in copending U.S. patent application, Serial No. 245,041, entitled "Pulse Generator Diode" filed December 17, 1962 by James L. Bowman et al.

The wave shaping and voltage limiting circuit of the present invention has several advantages over conventional circuits of this type, since the snap-off diode functions both as a wave shaping device and a voltage clamping device. This enables a more simple and inexpensive circuit to accomplish both of these purposes. In addition, the present wave shaping circuit produces rectangular voltage pulses having shorter rise times and shorter fall times. Furthermore, rectangular pulses of greater voltage amplitude can be produced by the present circuit because the clamping voltage level of a snap-off diode can be set higher on the wave form of an input signal having an uneven top portion, than the clamping voltage level of an ordinary diode, and still provide a flat top output pulse wave form. Also, the present circuit is more efficient than previous circuits because only two snap-off diodes are necessary to shape both the leading and trailing edges and to set both the upper and lower voltage limits of the output signal produced thereby.

It is, therefore, one object of the present invention to provide an improved wave shaping and voltage limiting circuit of a simple and inexpensive construction.

Another object of the present invention is to provide an improved wave shaping circuit in which snap-off diodes are employed in order to produce an output pulse having a shorter rise time and/or fall time than an input pulse applied to such circuit.

A further object of the present invention is to provide an improved voltage clamp circuit in which at least one snap-off diode is employed in order to enable the clamping voltage level to be set closer to the maximum amplitude of an input signal wave form applied to the circuit and still provide a flat top portion on output voltage wave form of such circuit.

An additional object of the present invention is to provide an improved wave shaping and voltage limiting circuit which operates in an efficient trouble-free manner to increase the slope of both the leading and trailing edges of an input signal applied thereto and to provide upper and lower voltage limits for the output signal produced thereby.

Still another object of the invention is to provide an improved pulse generator circuit for producing rectangular voltage pulses having small rise and fall times and having flat top and bottom portions.

Figure 2:
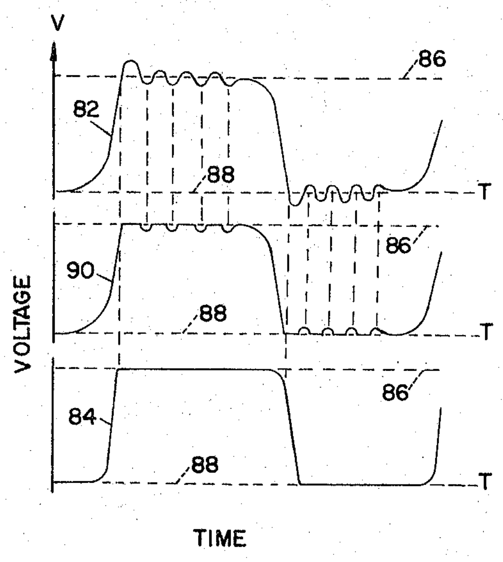

Other objects and advantages of the present invention will be apparent from the following detailed description of a preferred embodiment of the present invention and from the attached drawings of which:

FIG. 1 is a schematic diagram of one embodiment of the wave shaping and voltage limiting circuit of the present invention; and FIG. 2 shows the wave forms of an input signal and the output signals produced by the circuit of FIG. 1, and by a circuit employing only conventional diodes, in time relationship.

As shown in FIG. 1, one embodiment of the circuit of the present invention includes a first pair of snap-off diodes 10 and 12 with the anode of diode 10 connected in common with the cathode of diode 12 through a coupling resistor 14 of about 87.5 ohms to an input terminal 16. Each of the snap-off diodes 10 and 12 is connected through one of a pair of conventional PN junction diodes 18 and 20, to a common source of D.C. bias voltage at the movable contact of a potentiometer 22 of 1 kilohm. The end terminals of potentiometer 22 are connected to regulated D.C. voltage sources of +20 volts and −20 volts, respectively, so that the bias voltage produced on the movable contact of such potentiometer may be either positive or negative. The cathode of diode 18 is connected to the cathode of snap-off diode 10, and the anode of diode 20 is connected to the anode of snap-off diode 12 while the anode of diode 18 and the cathode of diode 20 are both connected to the movable contact of potentiometer 22. Therefore, when the movable contact of potentiometer 22 is positioned at a positive D.C. voltage, diode 18 is forwardly biased, and snap-off diode 10 is reversely biased by current flow through diode 18 and a pair of resistors 25 and 26 of 4.7 kilohms and 8.2 kilohms, respectively, connected in series between such movable contact and ground to form a voltage divider with the common terminal of such resistors connected to the cathode of snap-off diode 10. Diode 20 is reversely biased and snap-off diode 12 is forwardly biased, due to the D.C. bias current flowing through a second pair of voltage divider resistors 24 and 27 of 8.2 kilohms and 4.7 kilohms, respectively, connected between the movable contact of potentiometer 22 and ground and having their common terminal connected to the anode of the snap-off diode 12.

A pair of feed through type capacitors 28 and 30 of .001-microfarad, have their inner conductors, respectively, connected between the cathodes of diode 18 and snap-off diode 10 and between the anodes of diode 20 and snap-off diode 12 while their outer conductors are grounded. This enables the snap-off diodes to be electrostatically shielded from the D.C. bias source by a shield housing (not shown). In addition, a pair of frequency compensation networks are provided which respectively include a bypass capacitor 32 and 34 of about .04 microfarad with a shunt impedance formed by a resistor 36 and 38 of 5.6 ohms and a capacitor 40 and 42 of .02 microfarad. One of these networks is connected between the cathode of diode 18 and ground, and the other between the anode of diode 20 and ground. These frequency compensation networks provide an A.C. ground connection at the cathode of snap-off diode 10 and at the anode of snap-off diode 12.

One of the pair of snap-off diodes 10 and 12 is always conducting and the other of such snap-off diodes nonconducting, regardless of the polarity of the D.C. bias voltage applied to the movable contact of potentiometer 22. Thus the normally conducting snap-off diode will be rendered nonconducting by the leading edge of an input signal applied to the input terminal 16 to reduce the rise time of such leading edge by charge storage in such diode, while the other snap-off diode is rendered conducting. The trailing edge of such input signal then causes such other snap-off diode to be rendered nonconducting to reduce the fall time of such trailing edge by charge storage and renders such one snap-off diode again conducting. In this manner the leading edge and the trailing edge of the input signal always render one of the snap-off diodes nonconducting to provide wave shaping for both the leading and trailing edges of the input signal in order to increase the rise and fall times of the output signal produced by such snap-off diodes.

In addition, the D.C. bias voltage determined by the setting of the potentiometer 22, controls the upper limit and lower limit clamping voltages of the snap-off diodes 10 and 12. Thus the snap-off diode 10 is normally reversely biased when the D.C. voltage drop across resistor 25 is positive. A positive going input signal voltage applied to the anode of the snap-off diode 10 increases in value to a voltage slightly greater than the reverse bias voltage applied to the cathode of the snap-off diode before such diode is rendered conducting. In its conducting state the snap-off diode 10 has very little resistance so that the voltage on its anode does not increase above the voltage across resistor 25 by any appreciable amount when greater input signal voltages are applied thereto. Thus the positive going voltage on the anode of the snap-off diode 10 is clamped or limited to an upper limit voltage substantially equal to the positive D.C. bias voltage across resistor 25. Of course the snap-off diode does have a small finite resistance even when it is in a forward biased condition and some signal current does flow through resistor 25 so that the clamped voltage on the anode of such snap-off diode does not remain absolutely constant but varies slightly with signal current.

When the positive D.C. bias voltage is applied to the cathode of diode 20 such diode is rendered nonconducting to cause bias current to flow through resistor 24 to ground. A small portion of this bias current flows through the high resistance of resistor 27 to apply a small positive bias voltage to the anode of snap-off diode 12. The snap-off diode is rendered conducting by such bias voltage as long as the voltage of the input signal applied to the cathode of such snap-off diode is zero or negative with respect to ground. Thus the D.C. voltage drop across resistor 27 determines the lower limit clamping voltage of the output signal transmitted from the snap-off diodes 10 and 12. Of course most of the bias current through resistor 24 flows through the low impedance path to ground including snap-off diode 12 and resistors 52 and 56 so that the value of resistor 24 determines the forward bias current of such snap-off diode. The upper limit clamping voltage across resistor 25 is greater than the lower limit clamping voltage because diode 18 is biased conducting to effectively short circuit resistor 26, while diode 20 is nonconducting so that there is a large voltage drop across resistor 24. Thus the snap-off diode 12 shapes the positive going leading edge and limits the negative voltage swing of the input signal, while diode 10 shapes the negative going trailing edge and limits the positive voltage swing of such input signal. It should be noted that the conventional diodes 18 and 20 are employed primarily for temperature compensation of the snap-off diodes 10 and 12, respectively, in order to maintain the quiescent D.C. output voltage of the circuit of FIG. 1 at a substantially constant level. Also the clamping operation described above would be reversed if the tap of potentiometer 22 is moved to a negative D.C. bias voltage, which would be necessary with a negative voltage input signal.

The clamping and wave shaping operations of the snap-off diodes 10 and 12 are not perfect due to the small but finite amount of resistance of such diodes during conduction. This resistance causes a slight rounding at the bottom of the leading edge and at the top of the trailing edge of the output voltage wave form, and also prevents the top and bottom portions of such wave form from being exactly flat. The rectangular shape of the output voltage wave form can be improved by employing several stages of snap-off diodes and connecting such stages in cascade so that the output signal of one stage serves as the input signal of the next stage. While any number of stages may be employed, the circuit of FIG. 1 employs two such stages and includes a second pair of snap-off diodes 48 and 50 in the second stage. The anode of snap-off diode 48 is connected in common with the cathode of snap-off diode 50 through a current limiting coupling resistor 52 of 12.5 ohms to the output of the first stage at the common connection of the anode of snap-off diode 10 and the cathode of snap-off diode 12. Thus the output signal of the first stage is applied as an input signal to the second stage of the snap-off diodes 48 and 50, and the output signal of the second stage is transmitted to an output terminal 54 and produced across a load resistor 56 of about 50 ohms connected between such output terminal and ground.

The second stage of the wave shaping and voltage limiting circuit of FIG. 1 is similar to the first stage in that it also includes a pair of conventional PN junction diodes 58 and 60 each connected to one of snap-off diodes 48 and 50 through the inner conductor of feed through capacitors 62 and 64, respectively, of .001 micro-microfarad, having their outer conductors grounded. Shunt resistors 66 and 68 each of 8.2 kilohoms, are connected across diodes 58 and 60, respectively. Resistors 70 and 72 of 10 kilohms are connected, respectively, between the cathode of diode 58 and ground and between the anode of diode 60 and ground to form a pair of voltage dividers with resistors 66 and 68, respectively. In addition, bypass capacitors 74 and 76 each of .04 microfarad, are connected respectively between the cathode of diode 58 and ground, and between the anode of diode 60 and ground, to provide an A.C. signal path to ground. In order to bias the second pair of snap-off diodes 48 and 50 for maximum squaring of the output voltage wave form, potentiometers 78 and 80 of about 500 ohms, are connected at their end terminals between the movable contact of potentiometer 22 and ground. The movable contact of potentiometer 78 is connected to the anode of diode 58 and the movable contact of potentiometer 80 is connected to the cathode of diode 60. As a result a lower positive D.C. bias voltage is applied to resistors 70 and 68 of the second stage than to the equivalent resistors 25 and 24 of the first stage. Thus the upper limit clamping voltage produced across resistor 70 and applied to the cathode of snap-off diode 48 is less positive, and the lower limit clamping voltage produced across resistor 72 is less positive. Also the forward bias current of snap-off diode 50 is less than that of snap-off diode 12. The relative values of such bias voltages and currents are controlled by the setting of the movable contacts of potentiometers 78 and 80.

FIG. 2 shows an input signal 82 which may be applied to the input terminal 16 of the circuit of FIG. 1, such input signal having long rise and fall times, i.e. gradual vertical slopes of its leading and trailing edges, and having uneven top and bottom portions. The top and bottom portions of the input signal 82 each contain several ripples, including a positive overshoot at the top of the leading edge of such wave form and a negative overshoot at the bottom of the trailing edge. The circuit of FIG. 1 produces an output voltage signal 84 which is shown in time relation to this input signal so that it can be seen to have a leading edge which is slightly delayed with respect to the leading edge of the input signal 82 but has a much shorter rise time due to the snap-off operation of the snap-off diodes 12 and 50. The negative going trailing edge of output signal 84 is also delayed slightly with respect to the trailing edge of the input signal but has a shorter fall time due to the snap-off operation of snap-off diodes 10 and 48. Also the top and bottom portions of the output signal wave form 84 are substantially flat at the upper limit voltage level 86 and the lower limit voltage level 88 of the snap-off diodes, even though the ripples of the input signals cross over the clamping voltage levels. This may be explained by the fact that the minority carrier charges are injected through the PN junction of snap-off diodes 10 and 48 and stored when the positive ripple portion of the input signal exceeds the upper clamping voltage level 86. This stored charge maintains the voltage across such snap-off diode constant when the negative ripple portion of the input signal goes below the upper clamping voltage level. A similar operation takes place at the bottom portion of the input signal except that snap-off diodes 12 and 50 determine the lower limit clamping voltage level 88, and the negative peak of the ripple portion which go below the lower clamping voltage level cause the storage of minority carrier charge in the snap-off diodes 12 and 50 which "fills in" the positive peaks of such ripple portion above the lower clamping voltage and maintains the bottom of the output signal substantially flat.

As mentioned previously the leading and trailing edges of the output signal 84 are delayed slightly with respect to the leading and trailing edges of the input signal 82 but have much steeper slopes because the reduction of the minority carrier charge stored in the snap-off diode to a certain value, which varies between diodes, causes such snap-off diode to become abruptly nonconducting. Thus the positive going leading edge of output signal 84 is formed by the snap-off operation of diodes 12 and 50 while the negative going trailing edge of such output signal is formed by the snap-off operation of diodes 10 and 48. If conventional diodes were employed in place of the snap-off diodes, the resultant output signal would have a wave form such as shown at 90 for the same upper and lower clamping voltage levels. Thus, in order to obtain an output signal having flat top and bottom portions when using conventional limiting diodes, it is necessary to lower the clamping voltage below that of the ripple portion of the input signal so that the amplitude of such output signal is reduced considerably. Furthermore, the rise time and fall time of the conventional output signal 90 are substantially the same as the input signal.

It will be obvious to those having ordinary skill in the art that various changes may be made in the above described preferred embodiment of the present invention without departing from the spirit of the invention. For example, temperature compensation diodes 18, 20, 58 and 60 may be replaced by transistors or may be eliminated completely, and different component values may be employed other than those given. Therefore the scope of the invention should only be determined by the following claims.

I claim:

1. A wave shaping circuit, comprising:
a pair of snap-off diodes each having a pronounced minority carrier charge storage characteristic;
means connecting said snap-off diodes together and to an input terminal with opposite polarities;
a load impedance connected across said snap-off diodes and to an output terminal; and
means for forwardly biasing one snap-off diode and for reversely biasing the other snap-off diode so that an input signal applied to said input terminal causes said snap-off diodes to produce an output signal across said load impedance having a wave form whose leading and trailing edges have steeper slopes than the input signal.

2. A wave shaping and voltage limiting circuit, comprising:
a pair of snap-off diodes each having a PN junction and a pronounced charge storage characteristic due to the injection of minority current carriers through said junction, said snap-off diodes being connected together and to an input terminal with opposite polarities;
bias means for applying a D.C. bias voltage to each of said snap-off diodes to reversely bias one and to forwardly bias the other of said diodes;
a load impedance connected across said snap-off diodes and to an output terminal; and
coupling means connected to said input terminal, for applying the same input signal to both of said snap-off diodes to produce an output signal across said load impedance whose maximum voltage amplitude is limited by the bias voltage on said snap-off diodes and whose leading and trailing edges have steeper slopes than said input signal.

3. A wave shaping and voltage limiting circuit, comprising:
a plurality of pairs of snap-off diodes each having a PN junction and a pronounced charge storage characteristic due to the injection of minority current carriers through said junction, one diode having its anode connected at a common terminal to the cathode of the other diode in each pair of snap-off diodes to provide a plurality of cascaded stages;
coupling means connecting the common terminals of said snap-off diodes to an input terminal and to an output terminal;
bias means for applying a D.C. bias voltage to said snap-off diodes to reverse bias one diode and to forward bias the other diode of each pair of snap-off diodes; and
a load impedance connected to an output terminal.

4. A wave shaping and voltage limiting circuit, comprising:
a pair of snap-off diodes each having a PN junction and a pronounced charge storage characteristic due to the injection of minority current carriers through said junction, said snap-off diodes being connected together at a common terminal with opposite polarity;
a pair of temperature compensation diodes each having substantially no minority carrier charge storage and connected to the other terminal of a different one of said snap-off diodes in series with said one snap-off diode but of opposite polarity to maintain the D.C. voltage level at the output of said circuit substantially constant;
a coupling resistor connected between said common terminal and an input terminal;

bias means for applying a D.C. bias voltage to said compensation diodes and to said snap-off diodes to reverse bias one and to forward bias the other of said pair of compensation diodes and of said pair of snap-off diodes, said bias means including a variable source of D.C. voltage and a voltage divider resistance connected between said source and ground and having a portion of its resistance connected across said compensation diode;

a load impedance connected across said snap-off diodes and to an output terminal; and signal means connected for applying the same input signal to both of said snap-off diodes to produce an output signal across said load impedance whose maximum voltage amplitude is limited by the bias voltage on said snap-off diodes and whose leading and trailing edges have steeper slopes than said input signal.

5. A pulse shaping circuit for producing flat rectangular voltage pulses of short rise time and short fall time, comprising:

a first snap-off diode having an anode and a cathode;

a second snap-off diode having an anode and having a cathode connected to the anode of said first snap-off diode;

a coupling resistor connected between an input terminal and the common connection of said first and second snap-off diodes;

a load impedance connected between said common connection and ground; and bias means for applying a D.C. bias voltage to the cathode of said first snap-off diode and to the anode of said second snap-off diode to reversely bias one and to forwardly bias the other of said snap-off diodes, and for varying said bias voltage.

6. A pulse shaping circuit for producing rectangular voltage pulses of short rise time and short fall time, comprising:

a first snap-off diode having an anode and a cathode;

a second snap-off diode having an anode and having a cathode connected to the anode of said first snap-off diode;

a coupling resistor connected between a input terminal and the common connection of said first and second snap-off diodes;

bias means for applying a D.C. bias voltage to said first and second snap-off diodes to reversely bias one and to forwardly bias the other of said snap-off diodes, and for varying said bias voltage;

a first temperature compensation diode having an anode connected to said bias means and a cathode connected to the cathode of said first snap-off diode;

a second temperature compensation diode having a cathode connected to said bias means and an anode connected to the anode of said second snap-off diode;

a first pair of voltage divider resistors connected in series between said bias means and ground, with the common connection of said first pair of resistors connected to the cathode of said first snap-off diode for forwardly biasing said first snap-off diode when said first temperature compensation diode is normally reversely biased;

a second pair of voltage divider resistors, connected in series between said bias means and ground, with the common connection of said second pair of resistors connected to the anode of said second-snap-off diode for forwardly biasing said second snap-off diode when said second temperature compensation diode is normally reversely biased; and a load impedance connected across said first and second snap-off diodes and to an output terminal.

7. A pulse shaping circuit for producing rectangular voltage pulses of short rise time and short fall time, comprising:

a first pair of snap-off diodes each having an anode and a cathode with the anode of one connected to the cathode of the other of said first pair of snap-off diodes;

a second pair of snap-off diodes each having an anode and a cathode with the anode of one connected to the cathode of the other of said second pair of snap-off diodes;

a first coupling resistor connected between an input terminal and the common connection of said first pair of snap-off diodes;

a second coupling resistor connected between said common connection of said first pair of snap-off diodes and the common connection of said second pair of snap-off diodes; and bias means for applying a D.C. bias voltage to said first and second pairs of snap-off diodes to reversely bias one and to forwardly bias the other of the diodes in each pair of said snap-off diodes, and for varying said bias voltage.

References Cited by the Examiner

UNITED STATES PATENTS

| | | | |
|---|---|---|---|
| 2,927,223 | 3/1960 | Meirowitz | 307—88.5 |
| 3,076,902 | 2/1963 | VanDuzer et al. | 307—88.5 |
| 3,078,377 | 2/1963 | Brunschweiger | 307—88.5 |
| 3,205,375 | 9/1965 | Berry et al. | 307—88.5 |
| 3,209,171 | 9/1965 | Amodei | 307—88.5 |

ARTHUR GAUSS, *Primary Examiner.*

J. HEYMAN, *Assistant Examiner.*